United States Patent [19]
Uden et al.

[11] 4,120,020
[45] Oct. 10, 1978

[54] ELECTRONIC COMPONENT WITH HEAT COOLED SUBSTRATES

[75] Inventors: Edward Uden, Barmstedt; Wilhelm Schreihage, Hartenholm, both of Fed. Rep. of Germany; Johan Christiaan Jacobus Finck, Eindhoven, Netherlands

[73] Assignee: U.S. Philips Corporation, New York, N.Y.

[21] Appl. No.: 713,520

[22] Filed: Aug. 11, 1976

[30] Foreign Application Priority Data

Aug. 20, 1975 [DE] Fed. Rep. of Germany ....... 2536957

[51] Int. Cl.² .............................................. H05K 7/20
[52] U.S. Cl. .................................. 361/386; 361/415; 361/401; 361/388
[58] Field of Search ............... 174/68.5; 361/386, 387, 361/388, 401, 412, 415

[56] References Cited

U.S. PATENT DOCUMENTS

| | | | |
|---|---|---|---|
| 3,147,402 | 9/1964 | Hochstetler | 361/388 |
| 3,348,101 | 10/1967 | Klein | 361/388 |
| 3,395,318 | 7/1968 | Laermer | 361/386 |
| 3,648,113 | 3/1972 | Rathjen | 361/388 |
| 3,735,206 | 5/1973 | Pesek | 361/386 |
| 3,766,440 | 10/1973 | Baird | 361/388 |
| 3,793,720 | 2/1974 | Rijsewijk | 361/386 |

FOREIGN PATENT DOCUMENTS 1,365,877 9/1974 United Kingdom ..................... 361/387

Primary Examiner—Gerald P. Tolin
Attorney, Agent, or Firm—Frank R. Trifari; David R. Treacy

[57] ABSTRACT

An electronic module having two insulating substrates which are provided with printed wiring and which are connected to circuit elements, and mounted against opposite sides of a heat-dissipating body. The sides of the substrates are remote from the sides supporting the printed wiring and/or thin-layer circuit elements are glued to the heat-dissipating body which is between the substrates, and the required connection leads are enveloped by an insulating envelope.

5 Claims, 3 Drawing Figures

ELECTRONIC COMPONENT WITH HEAT COOLED SUBSTRATES

BACKGROUND OF THE INVENTION

The invention relates to an electronic module having two insulating substrates which are provided with surface wiring on at least one side and have connection leads which are connected to the surface wiring, circuit elements connected to the surface wiring arranged on the substrates and a heat-dissipating body arranged between the substrates.

Modules of this kind are commonly used when various passive and/or active circuit elements which generate rather large quantities of heat during operation must be closely interconnected for electrical and/or mechanical reasons. Examples in this respect are complete subcircuits such as input circuits for television receivers (see, for example, German Offenlegungsschrift No. 2,334,570 to which U.S. Pat. No. 3,939,429 corresponds), which cannot be realized in a single, monolithic integrated circuit for electrical and/or technological reasons.

It is already known (U.S. Pat. No. 3,290,756) to construct a circuit, for example, a multivibrator so that the individual passive and active circuit elements which together constitute the multivibrator are arranged between two substrates comprising surface wiring, the space between the components being filled by an insulating, heat-dissipating material. However, in a component of this kind the various circuit elements arranged between the two substrates must have the same height and it must be possible to bring both their ends in contact with the printed tracks; consequently, specially shaped and expensive circuit elements are required.

SUMMARY OF THE INVENTION

The object of the invention is to provide a module which enables the electrical interconnection of a large number of circuit elements, constructed in different manners, possibly also according to the thin-layer technique, particularly as microstrip lines, in a small space, and which at the same time provides adequate heat dissipation.

In accordance with the invention the substrates are interconnected, on their sides which are remote from the surface wiring, by the heat-dissipating body, the substrates, the connection leads and at least the portion of the heat-dissipating body which is situated between the substrates being enveloped by an insulating envelope, the connection leads which are connected to the first substrate being connected, whenever necessary, to the connection leads connected to the second substrate.

An electronic module of this kind is particularly attractive in that it combines a large number of different circuit elements connected to form one circuit in a small space; however, it still offers adequate heat dissipation and is readily connectable to other components.

In a preferred embodiment in accordance with the invention, the heat-dissipating body consists of two mechanically interconnected sub-bodies, each sub-body forming an integral unit with an attached, engaging substrate, the associated connection leads and the insulating envelope which connects these parts. The module can thus be manufactured in two parts which are easy to handle and which can be tested in advance, after which the complete module is permanently assembled. If the module must include large circuit elements, the large elements can be connected to the substrates on their side which faces the heat-dissipating body; the heat-dissipating body is then provided with recesses to accommodate these circuit elements.

If special adjustment of given circuit elements is required after inclusion in a circuit, in a further embodiment in accordance with the invention the heat-dissipating body and the envelope are provided with at least one opening wherethrough at least one circuit element is accessible from the outside. The circuit elements connected to the surface wiring on the substrates, which may be constructed at least partly as microstrip lines, are preferably constructed in accordance with the "beam-lead" technique and/or the "flip-chip" technique.

The drawings show a preferred embodiment of the electronic component in accordance with the invention which will be described in detail hereinafter.

DESCRPTION OF THE PREFERRED EMBODIMENT

Figure 3:
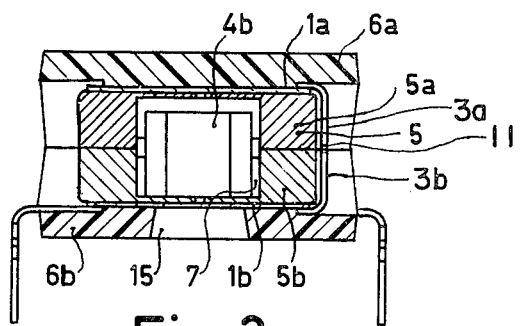
FIG. 3 is a sectional view of the module shown in FIG. 1, taken along the line III—III.

As is shown in particular in FIG. 3, the electronic module in accordance with the invention mainly consists of two substrates 1a and 1b which support the actual circuit and which are arranged one on each side of an elongated heat-dissipating body 5.

Figure 1:
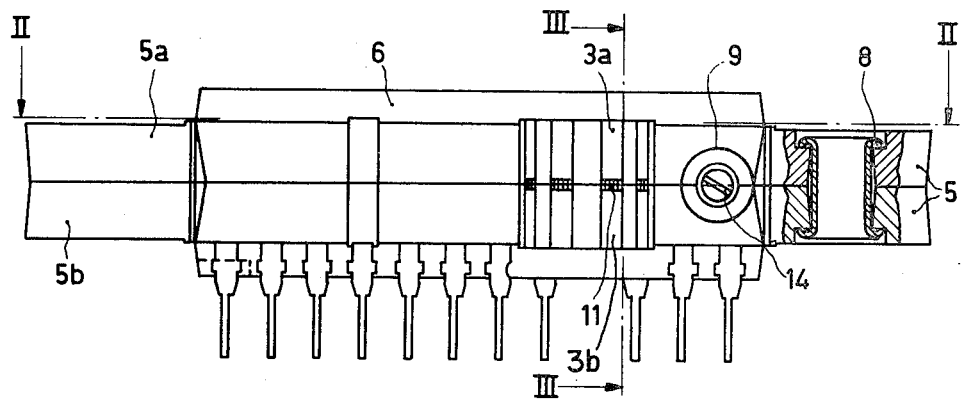
FIG. 1 is a side elevation of an electronic module in accordance with the invention.
Figure 2:
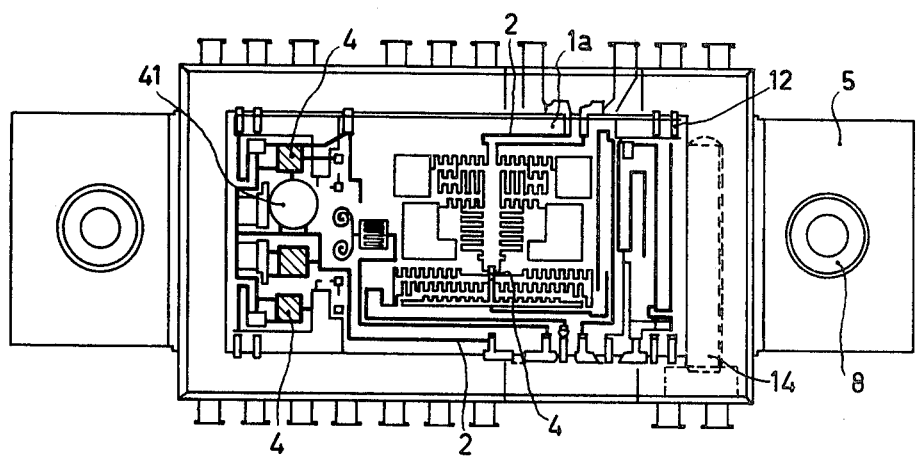
FIG. 2 is a sectional view of the module shown in FIG. 1, taken along the line II—II, and showing the printed circuitry on the outer surface of the upper substrate

These substrates 1a and 1b are made of an insulating material, for example, aluminum oxide ($Al_2C_3$). As is shown in FIG. 2, the outwardly directed side of each substrate (FIG. 2 shows the substrate 1a) is provided with a surface wiring 2, for example, by a multi-layer metallisation of Cu/Ni, Au, which interconnects the various circuit elements 4 and which itself may also comprise circuit elements, for example, inductances. The circuit elements, for example, passive and active circuit elements such as resistors, capacitors, diodes, transistors, integrated circuits, etc. constructed according to the beam-lead technique, are connected to the tracks on the substrates 1a and 1b, for example, by thermocompression. The tracks can be formed as so-termed microstrip lines. Particularly sensitive circuit elements for example, integrated circuits in beam-lead technique with air insulation, can be covered as desired by a cap 41 for protection against the mechanical forces occurring during the subsequent encapsulation.

The rear sides of the substrates 1a and 1b, which may be fully metallized for protection or for forming the ground electrode of the microstrip lines, are connected, for example by gluing, to the heat-dissipating body 5 which consists of two sub-bodies 5a and 5b. When use is made of a single heat-dissipating body 5, the two substrates are connected to the two principal faces of this single heat-dissipating body. This body not only serves for the dissipation of heat, but also as a mechanical support for the mechanical support for the mechanically very vunerable substrates 1a and 1b.

In order to enable very large circuit elements 4b to be accommodated in the electronic component, the heat-dissipating body 5 is provided with special recesses 7 which offer space for one or more large circuit elements 4b. These circuit elements are secured to the rear of one of the substrates 1 or to the heat-dissipating body 5b, and are connected to the circuit by way of connections extending through the heat-dissipating body and through the substrate 1b. The recess 7 can either be (as shown) only a cavity in the heat-dissipation body or may be a common recess extending through the sub-bodies.

For contacting of the circuit arrangement thus formed, connection leads 3a and 3b are connected, for example, ultrasonically, to the edges of the two substrates 1a and 1b. In order to connect the printed tracks on the upper side of each substrate to the metallization and possibly to special print tracks on the lower side of each substrate, special contact strips 12 are provided which grip around the edge of the substrate in order to realize this contact. However, it is alternatively possible to make special holes, for example, bores, in each substrate, the bores being internally metallized so as to form an electrical connection between the upper and the lower side of the substrate.

If the heat-dissipating body 5 consists of only a single body, the connection leads required for connecting the sub-circuits on the two substrates 1a and 1b are interconnected, and the unit formed by the heat-dissipating body 5 and the two substrates 1a and 1b and the connection leads 3a and 3b is enveloped by an insulating envelope 6. This envelope is made of a duroplastic synthetic material, deposited by transfer molding, such as commonly used in the manufacture of, for example, integrated circuits according to the dual-in-line technique.

In order to prevent the synthetic material, shrinking during cooling, from coming loose from the heat-dissipating body 5, this body can be provided at different areas with dovetail-shaped recesses which are also filled by the synthetic material, so that loosening is prevented.

The heat dissipating body 5 preferably consists (as is also shown in the Figures) of two portions 5a and 5b, so that intially each sub-body 5a, 5b forms a unit with the substrate 1a, 1b connected thereto and the associated connection lead 3a, 3b. Prior to the combination of these two units, each unit is peferably provided with an insulating envelope 6a, 6b of a duroplastic synthetic material which is deposited by transfer moulding.

If a circuit element 4b is arranged in a recess 7 of one or both heat-dissipating sub-bodies 5a and 5b, the part of the upper side of the substrate 1b which is opposite the face on which the circuit element 4b is to be arranged is left free when the substrate 1b and the cooling body 5b are provided with the envelope, so that at a later stage, when this circuit element 4b has been mounted, an electrical connection to the printed tracks on the upper side of the substrate 1b can be made. After the mounting of the circuit element 4b, the opening 15 in the envelope 6b can be filled with a suitable synthetic material.

However, if use is made of a singular heat-dissipating body, the circuit element 4b can be arranged in this body and connected to the substrate 1a or 1b prior to the provision of the envelope.

Each of these sub-units can then be tested and/or adjusted in advance and is subsequently connected to the other sub-unit so as to form the complete component by abutting the two heat-dissipating sub-bodies 5a and 5b together and by interconnection of the corresponding connection leads 3a and 3b at the points 11. The mechanical connection of the heat-dissipating sub-bodies 5a and 5b can be realized by permanently connecting the two sub-bodies by way of rivets, for example, tubular rivets, provided in bores 8. The openings through the tubular rivets can then be utilized for mounting the finished module with its heat-dissipating body on a further heat-dissipating substrate.

The connection leads 3a and 3b are preferably soldered or welded at the points 11. The joint between the connection leads is preferably a butt joint in order to ensure a defined impedance to electromagnetic waves. The connection lead connections 11 which are still exposed can be covered with a suitable synthetic material (not shown).

However, it is alternatively possible to combine the two sub-units into a final electronic component by way of a further envelope of a suitable material, for example, again a duroplastic synthetic material deposited by transfer molding. When it is necessary to maintain circuit elements included in the component, for example, the circuit element 4b arranged in the recesses 7 of the heat-dissipating bodies 5a and 5b, accessible from the outside for adjusting purposes, one or both heat-dissipating bodies 5a, 5b and the envelope 6a or 6b are provided with an opening 9 through which the circuit element can be reached with suitable adjusting means 14, or an externally operable control means. For example, a screw of a suitable material can be arranged in this opening 9.

Obviously, it is also possible for only one "half" of the described module, i.e., one substrate on a heat-dissipating body enclosed by a common envelope, to form a component which can be independently used.

What is claimed is:
1. An electronic module comprising:
   first and second insulating substrates each having a first side and surface wiring on a second side,
   a first heat-dissipating body attached to said first side of the first substrate,
   a second heat-dissipating body attached to said first side of the second substrate,
   means for making external electrical connections to the surface wiring of at least one of said substrates,
   at least two connection leads electrically connecting wiring on the first substrate to a wiring on the second substrate,
   means for permanently mechanically connecting said first and second heat-dissipating bodies together in abutting relationship, a first portion of each of said bodies being disposed between the two substrates and a second portion of each of said bodies extending beyond said substrates, and
   insulating material enveloping said substrates, said means for making external electrical connections, and said first portions.

2. A module as claimed in claim 1 wherein said heat-dissipating bodies each have at least one recess, said recesses being aligned to form a common recess, and said module includes at least one circuit element connected to one of the substrates on the second side of the substrate, said common recess accomodating said circuit element.

3. A module as claimed in claim 1, wherein said connection leads are exposed for making permanent electrical connection through an opening in said insulating material.

4. A module as claimed in claim 1 wherein said means for making external electrical connections comprise a plurality of connection leads connected to said first substrate only.

5. An electric module comprising:
first and second insulating substrates each having a first side and surface wiring on a second side,
a first heat-dissipating body having at least one recess, attached to said first side of the first substrate,
a second heat-dissipating body having at least one recess, attached to said first side of the second substrate,
means for making external electrical connections to the wire surface wiring of at least one of said substrates,
at least two connection leads electrically connecting wiring on the first substrate to a location on the second substrate,
means permanently mechanically connecting said first and second heat-dissipating bodies together in abutting relationship, a first portion of each of said bodies being disposed between the two substrates and a second portion of each of said bodies extending beyond said substrates, said recesses being within respective first portions and aligned to form a common recess,
at least one circuit element connected to one of the substrates on the second side of the substrate, and accommodated in said common recess, and
insulating material enveloping said substrates, said means for making external electrical connections, and said first portions, an opening extending through said enveloping material and at least one of said bodies to said common recess to permit adjustment of said circuit element.

* * * * *